(12) United States Patent
Kato et al.

(10) Patent No.: US 8,309,283 B2
(45) Date of Patent: Nov. 13, 2012

(54) METHOD AND APPARATUS FOR WRITING

(75) Inventors: Yasuo Kato, Kanagawa (JP); Jun Yashima, Kanagawa (JP); Hiroshi Matsumoto, Shizuoka (JP); Tomoo Motosugi, Shizuoka (JP); Tomohiro Iijima, Shizuoka (JP); Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 319 days.

(21) Appl. No.: 12/649,846

(22) Filed: Dec. 30, 2009

(65) Prior Publication Data

US 2010/0173235 A1 Jul. 8, 2010

(30) Foreign Application Priority Data

Jan. 6, 2009 (JP) ................. 2009-000729

(51) Int. Cl.
*G03C 5/00* (2006.01)
(52) U.S. Cl. ...... 430/30; 430/296; 430/942; 250/492.22
(58) Field of Classification Search .............. 430/30, 430/296, 942; 250/492.22
See application file for complete search history.

(56) References Cited

U.S. PATENT DOCUMENTS

| 7,525,110 B2 | 4/2009 | Suzuki et al. | |
| 2007/0187624 A1 * | 8/2007 | Suzuki et al. | 250/492.22 |

FOREIGN PATENT DOCUMENTS

JP 2007-220728 8/2007

OTHER PUBLICATIONS

U.S. Appl. No. 13/323,986, filed Dec. 12, 2011, Emi, et al.
U.S. Appl. No. 13/235,432, filed Sep. 18, 2011, Nakayamada, et al.
Takayuki Abe, et al. "Global Critical Dimension Correction: I. Fogging Effect Correction." Japanese Journal of Applied Physics, vol. 46, No. 6A, 2007, pp. 3359-3367.
U.S. Appl. No. 13/288,530, filed Nov. 3, 2011, Yashima.

* cited by examiner

*Primary Examiner* — Christopher Young
(74) *Attorney, Agent, or Firm* — Oblon, Spivak, McClelland, Maier & Neustadt, L.L.P.

(57) ABSTRACT

A writing method includes calculating a proximity effect-corrected dose for correcting a proximity effect in charged particle beam writing, for each first mesh region made by virtually dividing a writing region of a target object into a plurality of first mesh regions of a first mesh size, calculating a fogging effect-corrected dose by using the proximity effect-corrected dose calculated and an area density in the first mesh size with respect to a part of a calculation region for calculating the fogging effect-corrected dose for correcting a fogging effect in the charged particle beam writing, and by using an area density in a second mesh size larger than the first mesh size with respect to a remaining part of the calculation region, synthesizing the fogging effect-corrected dose and the proximity effect-corrected dose for the each first mesh region, and writing a pattern on the target object by using a charged particle beam based on a synthesized correction dose.

9 Claims, 7 Drawing Sheets

Related Art

METHOD AND APPARATUS FOR WRITING

CROSS-REFERENCE TO RELATED APPLICATION

This application is based upon and claims the benefit of priority from the prior Japanese Patent Application No. 2009-000729 filed on Jan. 6, 2009 in Japan, the entire contents of which are incorporated herein by reference.

BACKGROUND OF THE INVENTION

1. Field of the Invention

The present invention relates to a writing method and a writing apparatus. For example, it relates to an electron beam writing apparatus which can correct an exposure dose, and to a writing method thereof.

2. Description of Related Art

Microlithography technique that advances microminiaturization of semiconductor devices is extremely important and the unique process of forming a pattern in semiconductor manufacturing. In recent years, with high integration of large-scale integrated circuits (LSI), a line width (critical dimension) required for semiconductor device circuits is shrinking year by year. In order to form a desired circuit pattern on such semiconductor devices, a master or "original" pattern (also called a mask or a reticle) of high precision is needed. Then, the electron beam writing technique intrinsically having excellent resolution is used for producing such a highly precise master pattern.

FIG. 8 is a schematic diagram for explaining operations of a variable-shaped electron beam (EB) writing apparatus. As shown in the figure, the variable-shaped electron beam writing apparatus operates as follows: A first aperture plate 410 has a quadrangular such as rectangular opening 411 for shaping an electron beam 330. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. x direction) during writing or "drawing". In other words, a rectangle shaped as a result of passing through both the opening 411 and the variable-shaped opening 421 is written in the writing region of the target workpiece 340 on the stage. This method of forming a given shape by letting beams pass through both the opening 411 and the variable-shaped opening 421 is referred to as a VSB (Variable Shaped Beam) method.

When the electron beam irradiates a target workpiece, such as a mask, on which a resist film is applied, there are factors, such as a proximity effect and a fogging effect, that cause dimensional variation of the resist pattern. The proximity effect is a phenomenon where the electron beam emitted is reflected at the mask, thereby irradiating the resist again. The influence range of the proximity effect is about more than a dozen μm. By contrast, the fogging effect is a phenomenon where backward scattering electrons due to the proximity effect go out of the resist to scatter again at a lower part of the electron lens barrel and then reirradiate the mask, namely indicating a phenomenon of resist irradiation due to multiple scattering. The fogging effect affects a large region (from several mm to several cm) compared with the proximity effect. As one approach to highly accurately perform correction in calculating an influence of the fogging effect, there is disclosed a method of considering influence of the proximity effect (refer to, e.g., Japanese Patent Application Laid-open (JP-A) No. 2007-220728 (hereinafter to be referred to as Patent Literature 1)). Influence ranges of the fogging effect and the proximity effect greatly differ from each other intrinsically. Therefore, when calculating an influence of the proximity effect, the calculation is performed for each mesh region of a size sufficiently smaller than that used for calculating influence of the fogging effect. However, when calculating an influence of the fogging effect whose influence range is larger, it would take a long time if the influence of the proximity effect is calculated for each of all the regions each time. Then, according to the method of the Patent Literature 1, the mesh region for a proximity effect used for calculating a fogging effect is constituted by a mesh larger than an original mesh size for the proximity effect, and influence of the proximity effect used for calculating the fogging effect is separately computed for each mesh region for the proximity effect used for the fogging effect calculation.

In order to highly accurately perform writing with an electron beam, it is necessary to consider influence of the proximity effect and the fogging effect. A method for such consideration is disclosed in the Patent Literature 1. However, even when the mesh region for a proximity effect used for calculating a fogging effect is constituted by a mesh larger than an original mesh size for the proximity effect, it is still required to separately calculate the influence of the proximity effect used for fogging effect calculation, with respect to the entire region for the fogging effect calculation. Therefore, even though the time can be shortened compared with the case of separately performing calculation for each of all the regions by using an original mesh size for proximity effect, there still exists a problem that the time has not been yet sufficiently shortened.

Moreover, by using the method described in the Patent Literature 1, the case may exist where a proximity effect-corrected dose for fogging effect calculation is first computed with respect to the entire mask surface by using a mesh larger than an original mesh size for the proximity effect, and then further, a dose for fogging effect correction is computed, as a preprocessing prior to the writing operation. In that case, it is needed to previously prepare a computer resource necessary for creating a pattern area density map based on such a mesh size and calculating a dose for fogging effect correction, with respect to the entire mask surface. Then, it also becomes necessary to reduce such computer resource. Furthermore, even when calculating is performed as a preprocessing prior to the writing operation, it is desirable to reduce the previous calculation time in view of the entire writing time.

BRIEF SUMMARY OF THE INVENTION

An object of the present invention is to provide a pattern writing apparatus capable of more efficiently calculating an exposure dose where a proximity effect and a fogging effect have been corrected, and a method therefor.

In accordance with one aspect of the present invention, a writing method includes calculating a proximity effect-corrected dose for correcting a proximity effect in charged particle beam writing, for each first mesh region made by virtually dividing a writing region of a target object into a plurality of first mesh regions of a first mesh size, calculating a fogging effect-corrected dose by using the proximity effect-corrected dose calculated and an area density in the first mesh size with respect to a part of a calculation region for calculating the fogging effect-corrected dose for correcting a fogging effect in the charged particle beam writing, and by using an area density in a second mesh size larger than the first mesh size with respect to a remaining part of the calculation region, synthesizing the fogging effect-corrected dose and the proximity effect-corrected dose for the each first mesh region, and writing a pattern on the target object by using a charged particle beam based on a synthesized correction dose.

In accordance with another aspect of the present invention, a writing apparatus includes a proximity effect-corrected dose calculating unit configured to calculate a proximity effect-corrected dose for correcting a proximity effect in charged particle beam writing, for each first mesh region made by virtually dividing a writing region of a target object into a plurality of first mesh regions of a first mesh size, a fogging effect-corrected dose calculating unit configured to calculate a fogging effect-corrected dose by using the proximity effect-corrected dose calculated and an area density in the first mesh size with respect to a part of a calculation region for calculating the fogging effect-corrected dose for correcting a fogging effect in the charged particle beam writing, and by using an area density in a second mesh size larger than the first mesh size with respect to a remaining part of the calculation region, a synthesizing unit configured to synthesize the fogging effect-corrected dose and the proximity effect-corrected dose for the each first mesh region, and a writing unit configured to write a pattern on the target object by using a charged particle beam based on a synthesized correction dose.

DETAILED DESCRIPTION OF THE INVENTION

Embodiment 1

In the following Embodiments, there is described a structure using an electron beam as an example of a charged particle beam. However, the charged particle beam is not limited to the electron beam. Other charged particle beam, such as an ion beam, may also be used.

Figure 1:
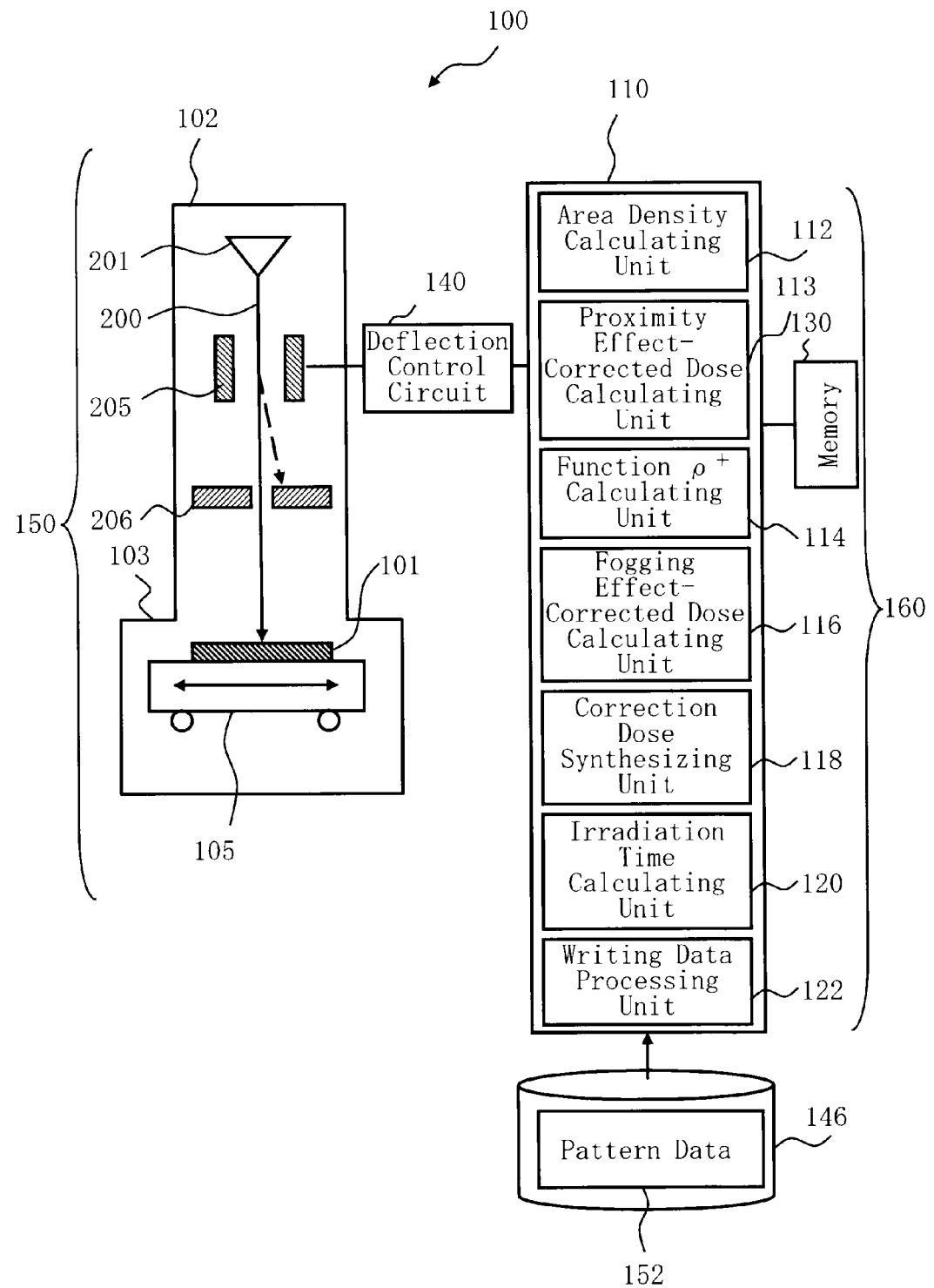
FIG. 1 is a schematic diagram showing an example of the main part structure of a writing apparatus according to Embodiment 1.

FIG. 1 is a schematic diagram showing an example of the main part structure of a writing apparatus according to Embodiment 1. In FIG. 1, a writing apparatus or "lithography apparatus" 100 includes a writing unit 150 and a control unit 160. The writing apparatus 100 is an example of a charged particle beam writing apparatus. The writing unit 150 includes an electron lens barrel 102 and a writing chamber 103. In the electron lens barrel 102, there are arranged an electron gun assembly 201, a blanking (BLK) deflector 205, and a blanking (BLK) aperture 206. In the writing chamber 103, there is arranged an XY stage 105. The control unit 160 includes a control computer 110, a memory 130 serving as an example of a storage device, a magnetic disk drive 146 serving as an example of a storage device, and a deflection control circuit 140. The control computer 110 has functions, such as an area density calculating unit 112, a proximity effect-corrected dose calculating unit 113, a function $\rho^+$ calculating unit 114, a fogging effect-corrected dose calculating unit 116, a correction dose synthesizing unit 118, an irradiation time calculating unit 120, and a writing data processing unit 122. Pattern data 152 stored in the magnetic disk drive 146 is input into the control computer 110 through the magnetic disk drive 146.

The control computer 110, the memory 130, the deflection control circuit 140, and the magnetic disk drive 146 are connected with each other via a bus (not shown). The deflection control circuit 140 is connected to the BLK deflector 205.

While only the structure elements necessary for explaining Embodiment 1 are shown in FIG. 1, it should be understood that other structure elements generally necessary for the writing apparatus 100 may also be included. Moreover, in FIG. 1, processing of each function, such as the area density calculating unit 112, the proximity effect-corrected dose calculating unit 113, the function $\rho+$ calculating unit 114, the fogging effect-corrected dose calculating unit 116, the correction dose synthesizing unit 118, the irradiation time calculating unit 120, and the writing data processing unit 122, may be implemented by software. Alternatively, they may be executed by hardware such as an electric circuit. Alternatively, they may be executed by a combination of hardware and software, or a combination of hardware and firmware. Data to be input into the control computer 110 or data being processed or having been processed is stored in the memory 130 each time.

An electron beam 200 emitted from the electron gun assembly 201 and controlled by a current density J irradiates a desired position of a target workpiece 101 on the XY stage 105 which is movably arranged. When an irradiation time period necessary for irradiating a desired exposure dose of the electron beam 200 onto the target workpiece 101 is attained, in order to prevent the electron beam 200 from excessively irradiating the target workpiece 101, the electron beam 200 is deflected by the blanking deflector 205 of an electrostatic type and cut by the blanking aperture plate 206, thereby preventing the electron beam 200 from reaching the target workpiece 101. The deflection voltage of the blanking deflector 205 is controlled by the deflection control circuit 140 and an amplifier (not shown).

In the case of beam-ON (blanking-OFF), the electron beam 200 emitted from the electron gun assembly 201 advances along the track shown in the solid line in FIG. 1. On the other hand, in the case of beam-OFF (blanking-ON), the electron beam 200 emitted from the electron gun assembly 201 advances along the track shown in the dotted line in FIG. 1. Moreover, the inside of the electron lens barrel 102 and the writing chamber 103 where the XY stage 105 is arranged is exhausted by a vacuum pump (not shown), and controlled to have a pressure lower than the atmospheric pressure.

While FIG. 1 shows only the structure elements necessary for explaining Embodiment 1, the electron lens barrel 102 of the pattern writing apparatus 100 may also be provided with an illumination lens, a first aperture plate, a projection lens, a shaping deflector, a second aperture plate, an objective lens, an object deflector, etc., in addition to the structure elements mentioned above. In the case of beam-ON (blanking-OFF) in the structure described above, the electron beam 200 emitted from the electron gun assembly 201 irradiates, by using the illumination lens, the entire of a first aperture plate having a quadrangular opening, such as a rectangular opening. At this point, the electron beam 200 is shaped to be a rectangle. Then, after passing through the first aperture plate, the electron beam 200 of a first aperture image is guided by the projection lens to reach the second aperture plate. The position of the first aperture image on the second aperture plate is controlled by the shaping deflector, and thereby the shape and size of the beam can be changed. After passing through the second aperture plate, the electron beam 200 of a second aperture image is focused by the objective lens and deflected by the object deflector, to reach a desired position on the target workpiece 101 placed on the XY stage 105 which is movably arranged. The variable-shaped beam writing apparatus is enabled by such structure.

By calculating an exposure dose D(x) emitted from the pattern writing apparatus 100 to irradiate the target object 101 by the following equation (1) using a base dose $D_{F0 \% P100}$, a fogging effect-corrected dose F(x), and a proximity effect-corrected dose $D_p(x)$, it becomes possible to correct influence of the proximity effect and the fogging effect.

$$D(x) = D_{F0 \% P100 \%} F(x) D_p(x) \quad (1)$$

The fogging effect-corrected dose F(x) can be generally defined by the following equation (2) using a coefficient $\zeta$, a fogging effect influence distribution $g_F(x)$, and a function $\rho^+(x)$.

$$F(x) = \frac{1}{1 + \zeta \int g_f(x - x') \rho^+(x') dx'} \quad (2)$$

However, if the fogging effect-corrected dose F(x) is calculated each time for the entire region of the target object 101 by using the formula (2), the computation time would be long like the conventional case. Then, according to Embodiment 1, when calculating the fogging effect-corrected dose F(x), the calculation region is divided into two regions A and B. Further, the fogging effect-corrected dose F(x) is defined by the following equation (3), instead of the equation (2), using a fogging effect correction coefficient $\theta$ and a proximity effect correction coefficient $\eta$.

$$F(x) = \frac{1}{1 + \zeta \int_A g_f(x - x') \rho^+(x') dx' + \theta \int_B \frac{g_f(x - x')}{1/2 + \eta \rho(x')} dx'} \quad (3)$$

The function $\rho^+(x)$ is defined by the following equation (4) using the proximity effect-corrected dose $D_p(x)$, a pattern area density $\rho(x)$, an original mesh size $\Delta_{P0}$ for proximity effect correction, and a mesh size $\Delta_F$ for fogging effect correction.

$$\rho^+(x) = \sum_i D_p(x_i) \rho(x_i) \Delta_{p0}^2 / \Delta_F^2 \quad (4)$$

Moreover, the coefficient $\zeta$ is defined by the following equation (5) using the fogging effect correction coefficient $\theta$ and the proximity effect correction coefficient $\eta$.

$$\zeta = \frac{\theta}{1/2 + \eta} \quad (5)$$

As shown in the equations (3) and (4), the accuracy of the fogging effect-corrected dose F(x) can be improved if considering the proximity effect-corrected dose $D_p(x)$. However, the influence range of a fogging effect is several cm while the influence range of a proximity effect is several tens of μm. Since it is appropriate for the size of a mesh region for use in calculating each correction to be about 1/10 of the influence range, dividing is performed for the mesh size (first mesh size) for proximity effect correction to be about 1 μm, for example, and dividing is performed for the mesh size (third mesh size) for fogging effect correction to be about 1 mm, for example. If the fogging effect-corrected dose F(x) is calculated using this size and considering the proximity effect-corrected dose $D_p(x)$, it becomes necessary to calculate 1000 mesh regions for proximity effect correction in order to calculate one mesh region for fogging effect correction. If such calculation is performed, time for processing of writing data takes a long time, and the writing operation will be rate controlled by this processing. Therefore, it becomes impossible to perform real-time writing. Then, conventionally, a fogging effect-corrected dose is calculated by using divided meshes of a size larger than the original mesh size for proximity effect correction and using the equation (2) for all over the surface of the target object 101.

However, when aiming to obtain the function $\rho^+(x)$ of the equation (2), it is not efficient to separately calculate a proximity effect-corrected dose for correcting a fogging effect by using a mesh size larger than an original mesh size for an original proximity effect correction, for the entire region where a fogging effect correction calculation is to be performed, in addition to the original proximity effect correction calculation. Then, according to Embodiment 1 as mentioned above, the fogging effect-corrected dose F(x) is calculated by using the equation (3). In this calculation, the calculation region is divided into two regions A and B. The second term of the denominator of the equation (3) is calculated with respect to the region A. The function $\rho^+(x)$ of the second term of the denominator of the equation (3) is calculated by using the proximity effect-corrected dose $D_p(x)$ which has already been obtained in the original proximity effect correction calculation. Thereby, with respect to the region A, it becomes possible to avoid to newly recalculate a proximity effect-corrected dose for correcting a fogging effect. Then, the third term of the denominator of the equation (3) is calculated with respect to the region B. The region B is calculated by using a mesh larger than an original mesh size for an original proximity effect correction. Thereby, the computation time can be greatly reduced.

Figure 2:
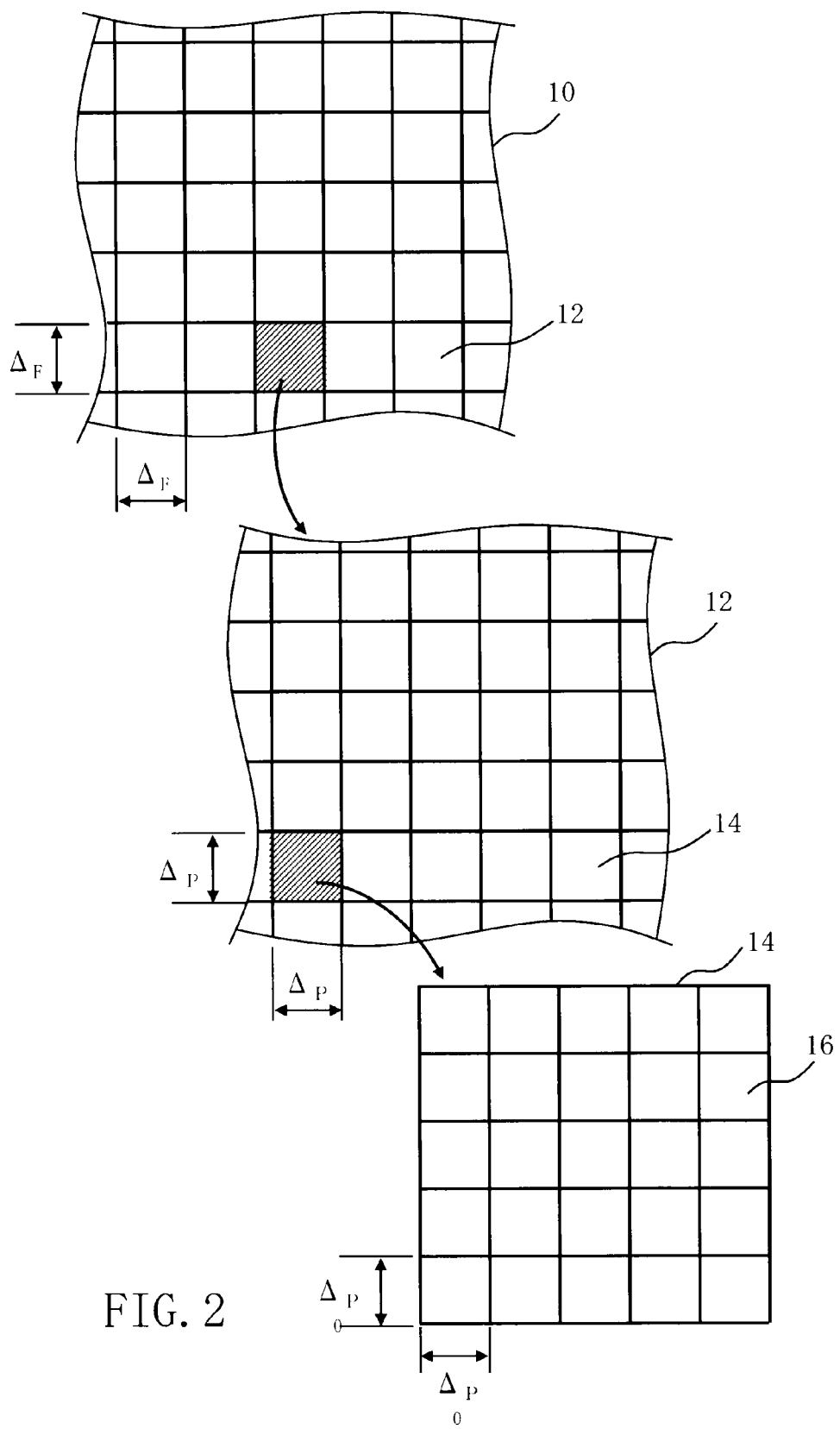
FIG. 2 is a schematic diagram showing a relation among mesh sizes according to Embodiment 1.

FIG. 2 is a schematic diagram showing a relation among mesh sizes according to Embodiment 1. In FIG. 2, a writing region 10 of the target object 101 is virtually divided into a plurality of mesh regions 12 (third mesh region) of a mesh size $\Delta_F$ (third mesh size) for calculating the fogging effect-corrected dose F(x). Moreover, to calculate the third term of the denominator of the equation (3), the writing region 10 is virtually divided into a plurality of mesh regions 14 (second mesh region) of a mesh size $\Delta_P$ (second mesh size) larger than the original mesh size $\Delta_{P0}$ for correcting a proximity effect. Furthermore, the writing region 10 is virtually divided into a plurality of mesh regions 16 (first mesh region) of a mesh size $\Delta_{P0}$ (first mesh size) being 1/10 of the influence range of a proximity effect in order to calculate the original proximity effect-corrected dose $D_p(x)$.

Figure 3:
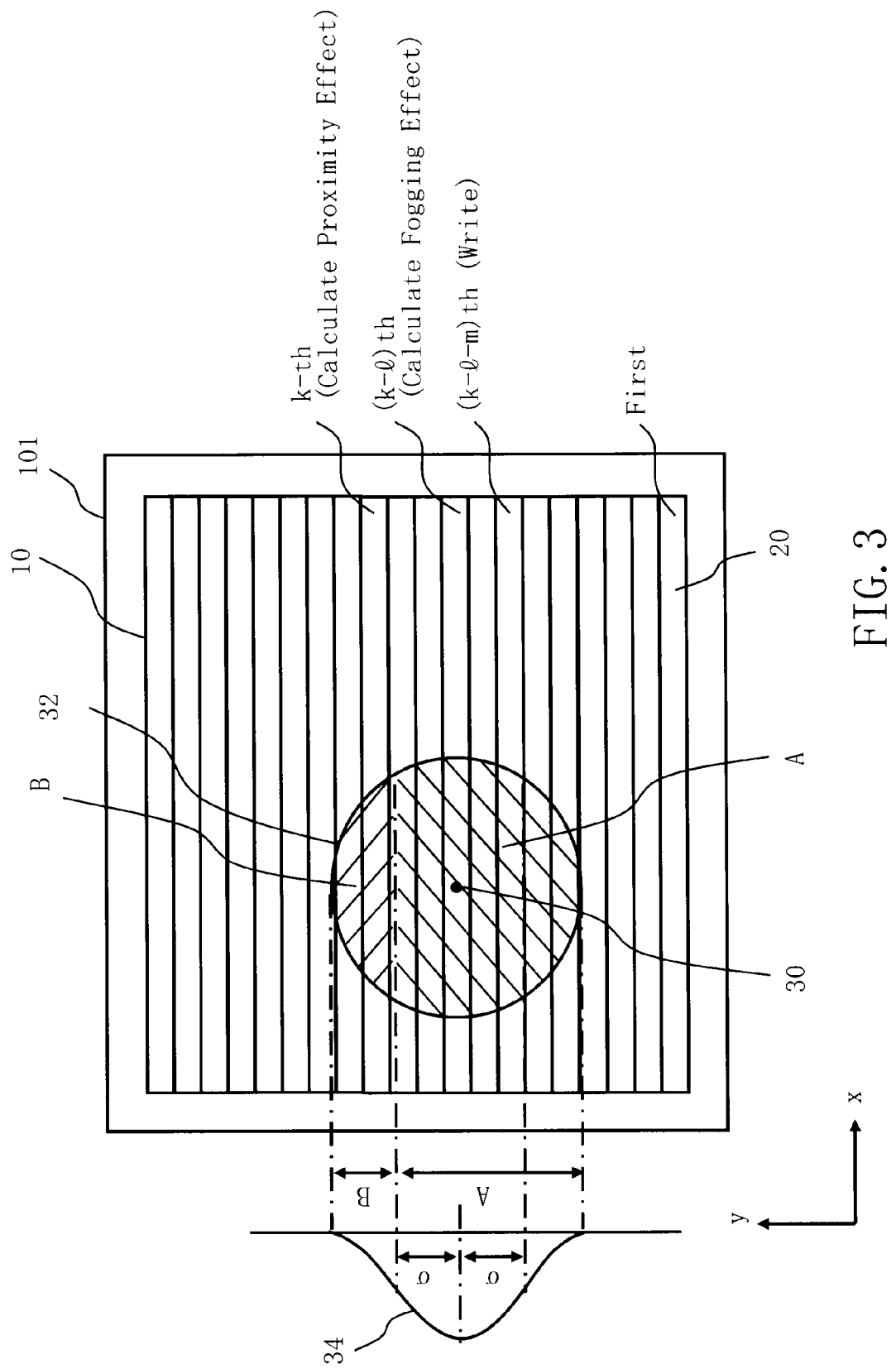
FIG. 3 is a schematic diagram for explaining a calculation region in correcting a fogging effect, and a real-time operation according to Embodiment 1.

FIG. 3 is a schematic diagram for explaining a calculation region in correcting a fogging effect, and a real-time operation according to Embodiment 1. In FIG. 3, the writing region 10 of the target object 101 is virtually divided into a plurality of strip-like stripes 20 (small region) of a predetermined width in e.g., the y direction, in addition to the mesh dividing described above. It is preferable to define the stripe 20 as a writing unit region when writing a pattern on the target object 101. The writing operation is performed in the y direction in order from the first stripe 20 in such a manner that the second stripe 20 is written after the first stripe 20 has been written.

Moreover, in one stripe 20, writing is performed in the x direction from the left end, for example. Practically, the writing operation advances relatively in the x direction by the movement in the −x direction of the XY stage 105.

For writing a pattern by irradiating the target object 101 with the electron beam 200, the beam dose itself needs to be determined. Then, in order to perform such a writing operation, it is necessary that the proximity effect-corrected dose $D_p(x)$ and the fogging effect-corrected dose $F(x)$ have already been calculated for the stripe 20 to be written. Therefore, according to Embodiment 1, when the proximity effect-corrected dose $D_p(x)$ is calculated for the k-th stripe 20, the fogging effect-corrected dose $F(x)$ is calculated for the (k−l)th stripe 20 at the same time, and writing is performed for the (k−l−m)th stripe 20 of the target object 101 at the same time. k and l are integers greater than or equal to 1 "one". m is an integer greater than or equal to 0. (k−l) is greater than 0. (k−l−m) is greater than 0. According to Embodiment 1, since the time for calculating the fogging effect-corrected dose $F(x)$ can be greatly reduced compared with the time for calculating the proximity effect-corrected dose $D_p(x)$, it may be possible to perform calculating the fogging effect-corrected dose $F(x)$ and writing the target object 101 on the same stripe 20 in real time.

As described above, the calculation of the proximity effect-corrected dose $D_p(x)$, the calculation of the fogging effect-corrected dose $F(x)$, and the writing operation proceed in real time. Thus, the writing time can be shortened by executing each processing in parallel in real time. However, it is not limited to the real-time operation. Calculating the proximity effect-corrected dose $D_p(x)$ may be performed in advance prior to the writing. Alternatively, calculating the proximity effect-corrected dose $D_p(x)$ and the fogging effect-corrected dose $F(x)$ may be performed in advance prior to the writing.

The influence range of a proximity effect is small enough to be included in the stripe 20. However, since the influence range of a fogging effect is several cm, it extends over two or more stripes 20. It is preferable to treat a radius ±3σ of the influence of a fogging effect, where 99.74% of a fogging effect influence distribution 34 is included, as a calculation range 32 of the fogging effect-corrected dose. Moreover, when calculating the fogging effect-corrected dose, it is preferable to use a calculation result obtained in the mesh region of the original mesh size $\Delta_{P0}$ for the original proximity effect correction, with respect to the region of about the fogging effect influence radius ±1σ, where 68.26% of the fogging effect influence distribution 34 is included. Therefore, it is preferable that the proximity effect-corrected dose $D_p(x)$ has already been calculated for the region of a radius 1σ from a position 30 at which the dose for fogging effect correction is calculated.

Then, according to Embodiment 1, the calculation range 32 of the dose for fogging effect correction is divided into two regions A and B: the region A not exceeding 1σ, in the y direction being the moving direction of the writing operation, from the calculation position of the fogging effect-corrected dose, and the region B exceeding 1σ in the y direction. That is, the circular calculation range 32 is separated into the two regions A and B by a straight line which extends in the x direction and is at the position 1σ, in the y direction being the moving direction of the writing operation, from the calculation position of the fogging effect-corrected dose. With respect to the region A, the calculation result of the proximity effect-corrected dose $D_p(x)$ that has already been calculated in the mesh region of the original mesh size $\Delta_{P0}$ for correcting the proximity effect is used. The function $\rho^+(x)$ is calculated by the equation (4) using the proximity effect-corrected dose $D_p(x)$. Then, when calculating the equation (3), the calculated function $\rho^+(x)$ is used for the region A. With respect to the region B, an area density $\rho(x)$ in the mesh region of the mesh size $\Delta_P$ larger than the original mesh size $\Delta_{P0}$ for correcting the proximity effect is used. Based on the above, the operation will now be explained with reference to a flowchart.

Figure 4:
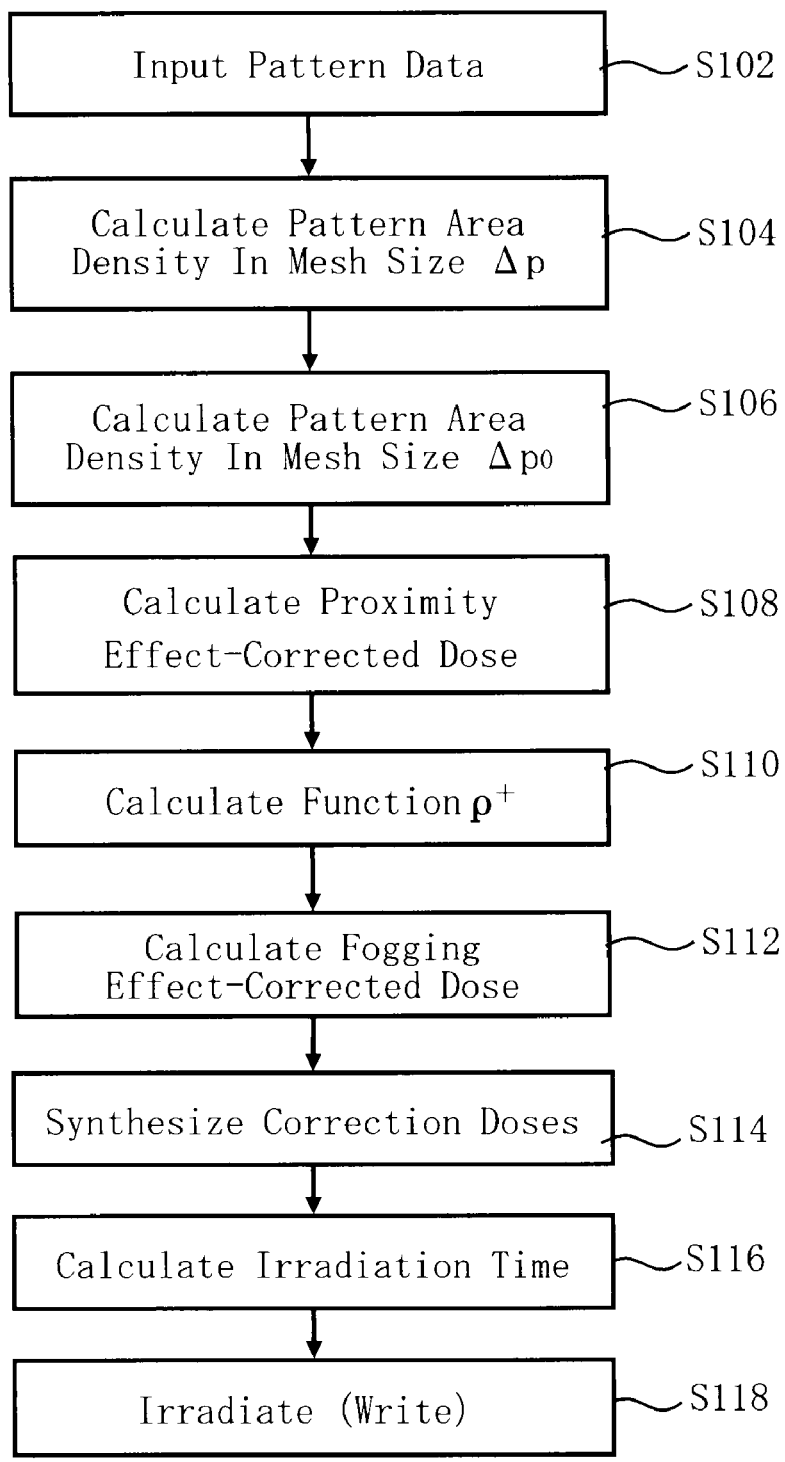
FIG. 4 shows a main part of a flowchart of a writing method according to Embodiment 1.

FIG. 4 shows a main part of a flowchart of a writing method according to Embodiment 1. In FIG. 4, the electron beam writing method executes a series of steps: a pattern data input step (S102), an area density calculation step (S104) using a mesh size ΔP, an area density calculation step (S106) using a mesh size $\Delta P_0$, a proximity effect-corrected dose calculation step (S108), a function $\rho^+$ calculation step (S110), a fogging effect-corrected dose calculation step (S112), a correction dose synthesis step (S114), an irradiation time calculation step (S116), and an irradiation step (S118).

In step S102, as a pattern data input step, the control computer 110 inputs the pattern data 152 through the magnetic disk drive 146. The writing data processing unit 122 generates shot data based on the pattern data 152. Moreover, the writing data processing unit 122 virtually divides the writing region 10 of the target object 101 into a plurality of mesh regions 12 of a mesh size $\Delta_F$. Similarly, the writing data processing unit 122 virtually divides the writing region 10 of the target object 101 into a plurality of mesh regions 14 of a mesh size $\Delta_P$. Similarly, the writing data processing unit 122 virtually divides the writing region 10 of the target object 101 into a plurality of mesh regions 16 of a mesh size $\Delta_{P0}$. It is preferable for the mesh size $\Delta_P$ to be greater than or equal to 100 times the mesh size $\Delta_{P0}$. For example, if the mesh size $\Delta_{P0}$ is 1 μm, it is preferable for the mesh size $\Delta_P$ to be greater than or equal to 100 μm. Moreover, it is preferable for the mesh size $\Delta_F$ to be about 1 mm.

In step S104, as an area density calculation step, the area density calculating unit 112 calculates a pattern area density $\rho(x)$ for each mesh region 14 made by virtually dividing the writing region 10 into a plurality of mesh regions 14 of a mesh size $\Delta_P$. It is here preferable that the calculation has been performed in advance prior to starting writing, for the entire writing region 10 of the target object 101. Then, results of the calculation may be stored in the memory 130 or the magnetic disk drive 146. However, it is not limited to calculating in advance prior to starting writing, for the entire writing region 10, and it is also acceptable to perform a parallel calculation in real time in order.

In step S106, as an area density calculation step, the area density calculating unit 112 calculates a pattern area density $\rho(x)$ for each mesh region 16 made by virtually dividing the writing region 10 into a plurality of mesh regions 16 of a mesh size $\Delta_{P0}$. It is also here preferable that the calculation has been performed in advance prior to starting writing, for the entire writing region 10. Then, results of the calculation may be stored in the memory 130 or the magnetic disk drive 146.

However, it is not limited to calculating in advance, prior to starting writing, for the entire writing region 10, and it is also acceptable to perform a parallel calculation in real time in order. The calculated pattern area density ρ(x) is stored in the memory 130.

In step S108, as a calculation step of a proximity effect-corrected dose, the proximity effect-corrected dose calculating unit 113 calculates a proximity effect-corrected dose $D_p(x)$ for correcting a proximity effect generated in electron beam writing, for each mesh region 16 in the k-th stripe 20 by using the proximity effect correction coefficient η, the pattern area density ρ, and the proximity effect influence distribution $g_p(x)$. The formula may be the same as that of prior art. In this case, the proximity effect-corrected dose $D_p(x)$ at the central position of each mesh region 16 is calculated. The calculated proximity effect-corrected dose $D_p(x)$ is stored in the memory 130. The proximity effect-corrected dose calculating unit 113 starts the calculation sequentially from the first stripe 20.

In step S110, as a function $ρ^+$ calculation step, the $ρ^+$ calculating unit 114 calculates a function $ρ^+(x)$ by the equation (4) using the proximity effect-corrected dose $D_p(x)$ and the area density ρ(x) in the mesh region of the mesh size $Δ_{P0}$ which are calculated in the previous step. The function $ρ^+(x)$ may be calculated in parallel in the same stripe 20 where the proximity effect-corrected dose $D_p(x)$ is being calculated, and alternatively, it may be calculated in parallel for the previous stripe where the calculation has already been completed. The calculated function $ρ^+(x)$ is stored in the memory 130.

In step S112, as a calculation step of a fogging effect-corrected dose, the fogging effect-corrected dose calculating unit 116 calculates a fogging effect-corrected dose F(x) for correcting a fogging effect generated in electron beam writing, by using the already calculated function $ρ^+$ for the region A of the calculation range 32, and the already calculated area density ρ(x) in the mesh region of the mesh size $Δ_P$ for the region B of the range 32. In other words, with respect to the region A, the fogging effect-corrected dose F(x) is calculated by using the already calculated proximity effect-corrected dose $D_p(x)$ and the already calculated area density ρ(x) in the mesh region of the mesh size $Δ_{P0}$. Although calculating the fogging effect-corrected dose F(x) and calculating the function $ρ^+(x)$ are independently performed in Embodiment 1, it should be understood that it is also acceptable to simultaneously calculate the function $ρ^+(x)$ while calculating the fogging effect-corrected dose F(x), by developing the function $ρ^+(x)$ of the equation (3) as shown in the equation (4). With respect to the region A, since each of the computation time of the second term of the denominator of the equation (3) and the computation time of the equation (4) is considerably shorter than that of the proximity effect-corrected dose $D_p(x)$, the operation is not rate controlled by them even if the equations (3) and (4) are separately calculated or they are simultaneously calculated. When calculating the third term of the denominator of the equation (3) for the region B, which is smaller than the half of the calculation range 32, since it is enough to perform the calculation for each mesh region 14 of the mesh size $Δ_P$, the computation time can be short. Specifically, the computation time can be considerably reduced compared with the conventional case where the calculation is performed for each mesh region 14 of the mesh size $Δ_P$ for the entire calculation range 32. In particular, while the mesh size $Δ_P$ is about 5 times the mesh size $Δ_{P0}$ in the conventional case, the mesh size $Δ_P$, is greater than or equal to 100 times the mesh size $Δ_{P0}$ in Embodiment 1; when the mesh size $Δ_{P0}$ is 1 μm, the mesh size $Δ_P$ is greater than or equal to 100 μm, for example, thereby further shortening the computation time.

Since the region B is located at the position over 1σ, it is enough for it to be divided into coarse meshes. The calculated fogging effect-corrected dose F (x) is stored in the memory 130.

In step S114, as a correction dose synthesis step, the correction dose synthesizing unit 118 synthesizes the fogging effect-corrected dose F(x) and the proximity effect-corrected dose $D_p(x)$ for each mesh region 16 in order to calculate an exposure dose D(x). The correction dose synthesizing unit 118 reads the proximity effect-corrected dose $D_p(x)$ and the fogging effect-corrected dose F(x) from the memory 130, and calculates a product of the proximity effect-corrected dose $D_p(x)$, the fogging effect-corrected dose F(x), and the base dose $D_{F0\ \%\ P100}$, in accordance with the equation (1). Then, the calculated exposure dose D(x) is stored in the memory 130.

In step S116, as an irradiation time calculation step, the irradiation time calculating unit 120 reads the exposure dose D(x) from the memory 130, and calculates an irradiation time T (=(exposure dose D(x))/(current density J)) by using a current density J.

In step S118, as an irradiation step (also a writing step), the control computer 110 outputs a signal to the deflection control circuit 140 so that the beam irradiation to the target object 101 may become OFF when the calculated irradiation time T has elapsed. Then, based on this signal, the deflection control circuit 140 controls the blanking deflector 205 to deflect the electron beam 200 in accordance with the calculated irradiation time T. Then, the desired exposure dose D(x) is emitted toward the target object 101, and the electron beam 200 deflected by the blanking deflector 205 of the writing unit 150 is blocked by the blanking aperture 206 so that it may not reach the target object 101. The shape and the position of the irradiating beam are determined according to the shot data. Thus, the writing unit 150 writes a pattern onto the target object 101 by using the electron beam 200 based on the synthesized correction dose.

Next, there will be explained simulation results concerning a correction residual and a shortening effect of computation time according to the structure of Embodiment 1.

Figure 5:
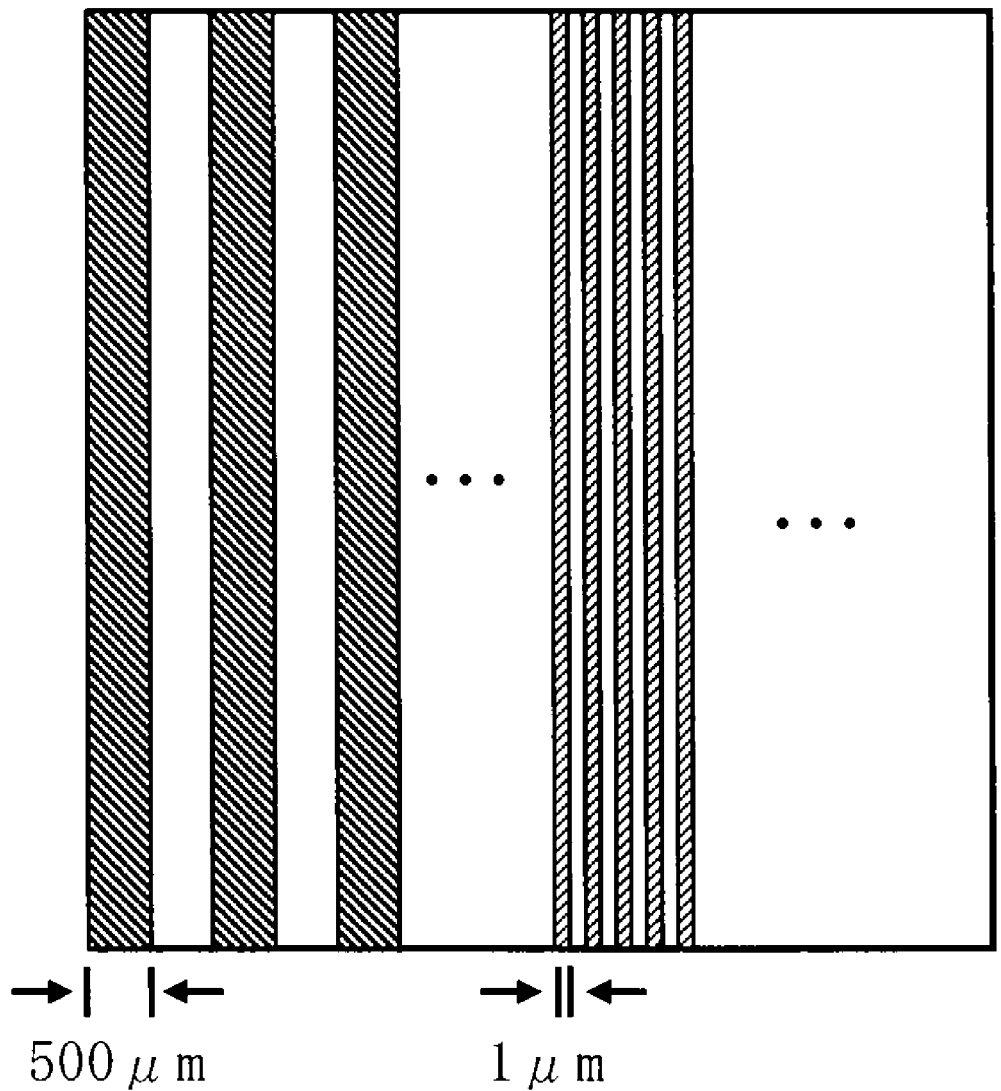
FIG. 5 is a schematic diagram showing an example of an evaluation pattern according to Embodiment 1.

FIG. 5 is a schematic diagram showing an example of an evaluation pattern according to Embodiment 1. FIG. 5 shows a simulation of writing 1:1 line and space patterns with a width of 500 μm arranged in one side of the region and 1:1 line and space patterns with a width of 1 μm arranged in the other side of the region.

Figure 6:
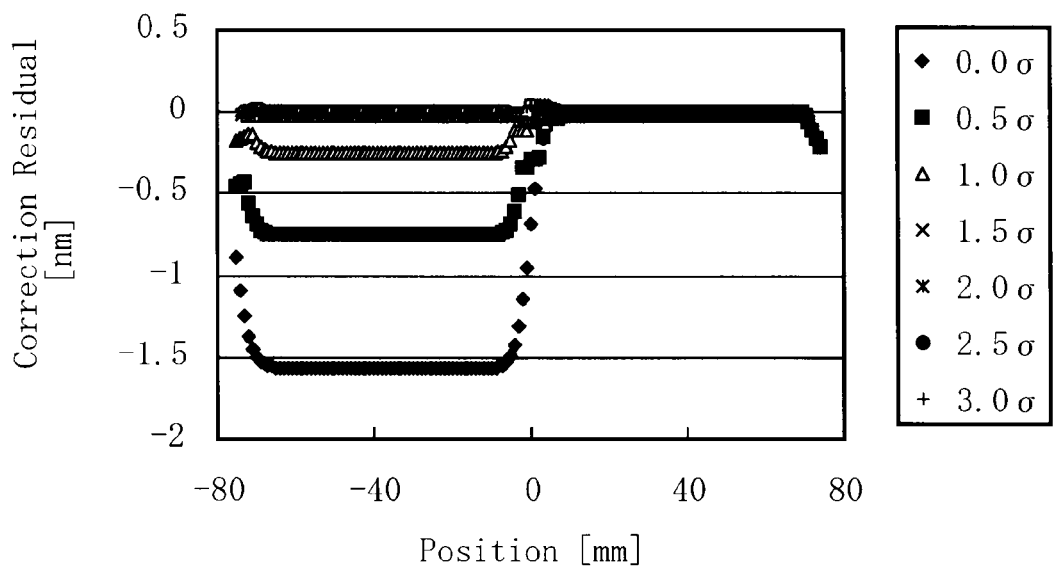
FIG. 6 is a graph showing a correction residual when writing the evaluation pattern of FIG. 5.

FIG. 6 is a graph showing a correction residual when the evaluation pattern of FIG. 5 is written. In FIG. 6, there is shown a correction residual in the case of changing the range of the regions A and B in calculating the fogging effect-corrected dose F(x). The position of "0" shows the boundary between the 1:1 line and space pattern with a width of 500 μm and the 1:1-line and space pattern with a width of 1 μm. 0.0σ denotes the case in which the region A is at 0 from the calculation position of the fogging effect-corrected dose, that is, in which a half of the calculation range 32 of the fogging effect-corrected dose serves as the region B. On the contrary, 3.0σ denotes the case in which the region A is at 3σ from the calculation position of the fogging effect-corrected dose, that is, in which the whole of the calculation range 32 of the fogging effect-corrected dose serves as the region A and there is no region B. The result is that, in the 1:1 line and space patterns with a width of 1 μm smaller than the influence range of a proximity effect, a correction residual is small enough to be disregarded in both the cases of 0.0σ and 3.0σ, whereas in the 1:1 line and space patterns with a width of 500 μm larger than the influence range of a proximity effect, a correction residual greatly differs depending upon how the regions A and B are set. Since it is desirable for a correction residual to be less than or about equal to 0.5 nm, for example, it can be understood that it is preferable that the region greater than or about equal to 1σ in the y direction from the calculation position of the dose for fogging effect correction is set as the region A.

Figure 7:
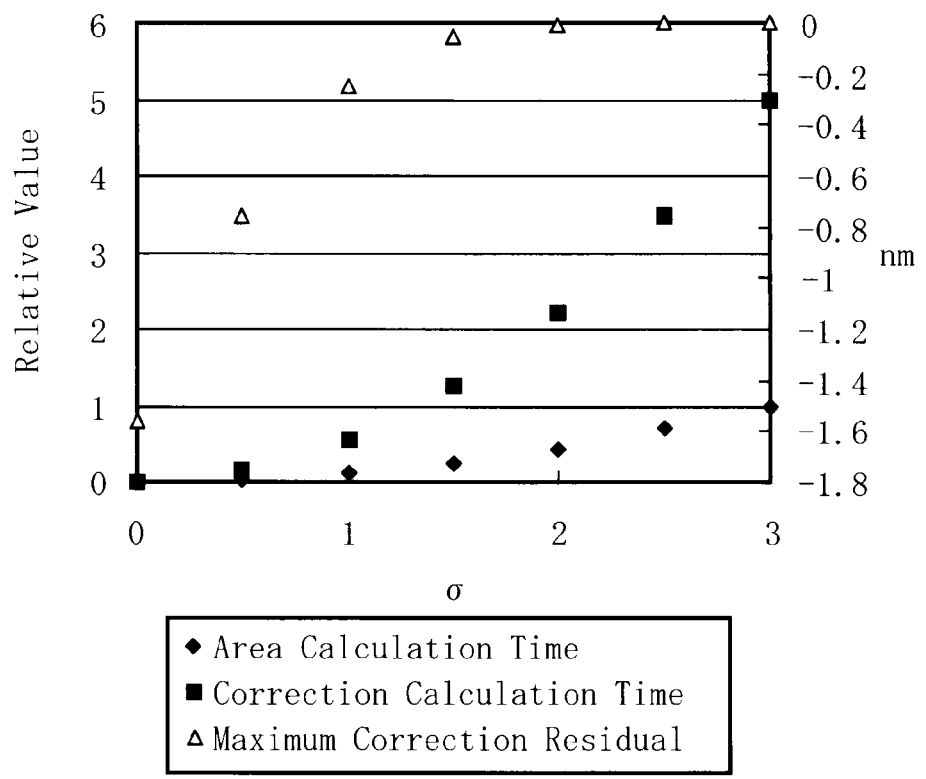
FIG. 7 is a graph showing an area density calculation time, a correction calculation time, and a maximum correction residual of when writing the evaluation pattern of FIG. 5.
Figure 8:
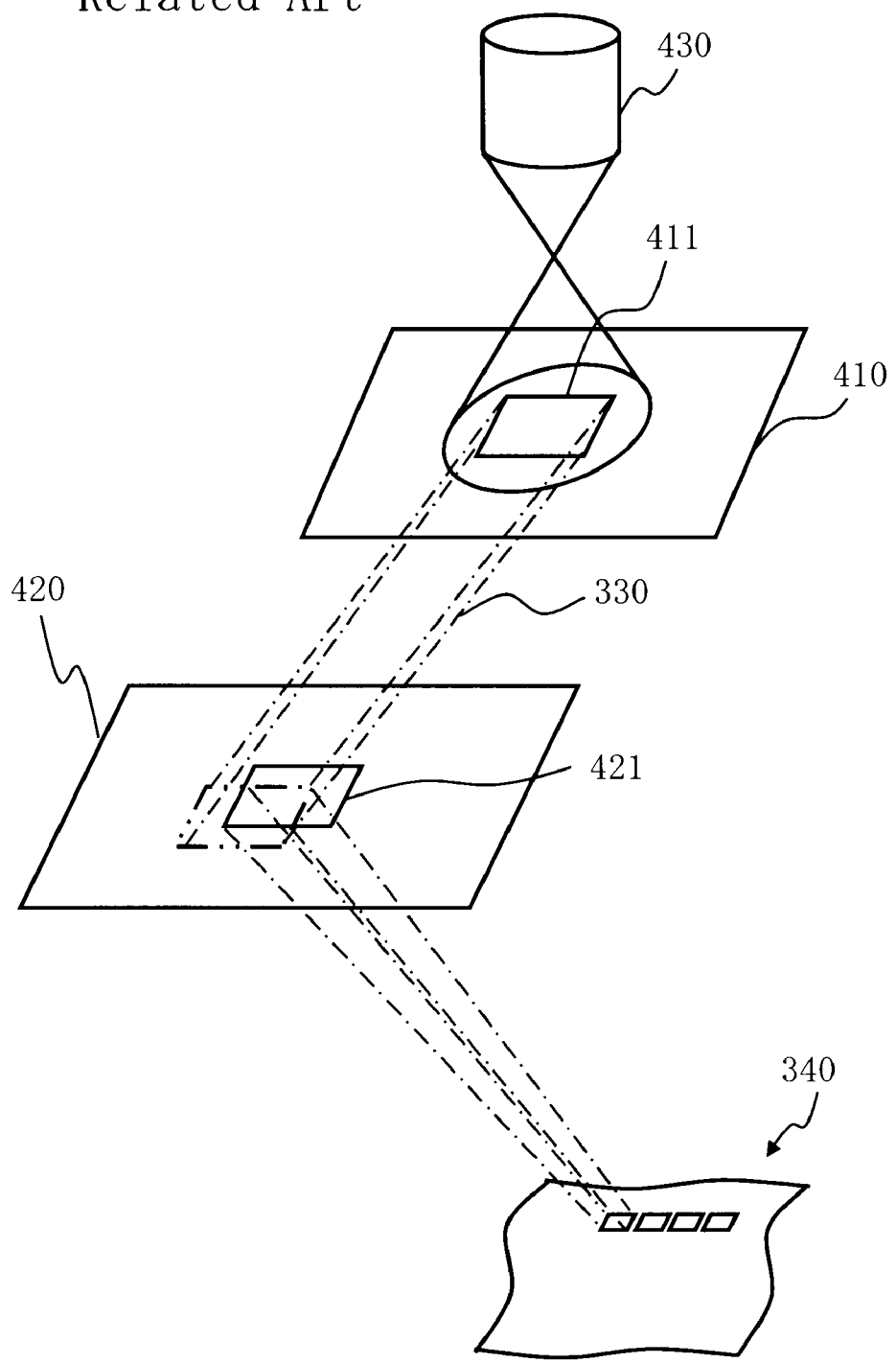
FIG. 8 is a schematic diagram for explaining operations of a variable-shaped electron beam writing apparatus.

FIG. 7 is a graph showing an area density calculation time, a correction calculation time, and a maximum correction residual of when writing the evaluation pattern of FIG. 5. In FIG. 7, if assuming it is desirable for the correction residual to be less than or about equal to 0.5 nm, for example, as explained in FIG. 6, it can be understood that it is preferable to set the region A to be greater than or about equal to in from the calculation position of the fogging effect-corrected dose.

According to Embodiment 1, before starting writing the first stripe 20, the proximity effect-corrected dose $D_p(x)$ of each mesh region 16 of a mesh size $\Delta_{P0}$ needs to have been calculated in advance for at least the region A. Therefore, an adequate time for correction computation is required before starting the writing. Also, as a preprocessing prior to starting the writing operation, when firstly calculating a proximity effect-corrected dose for calculating a fogging effect by using a mesh larger than the original mesh size for the original proximity effect and then calculating a fogging effect-corrected dose, for the entire mask surface by using the method described in the Patent Literature 1, it also becomes necessary to have an adequate time for correction computation. FIG. 7 shows a result of comparing the case of Embodiment 1 and the case of the Patent Literature 1 regarding the time for correction computation. The relative value 1 indicates a conventional correction computation time. Therefore, in order to shorten the preliminary calculation time compared with the conventional case, the relative value needs to be less than 1. FIG. 7 shows that when it is less than or about equal to 1.3σ from the calculation position of the fogging effect-corrected dose based on the method of Embodiment 1, the relative value is less than 1. Moreover, when it is about 1σ, the computation time can be reduced to about ½ of the conventional case.

According to Embodiment 1, before starting writing the first stripe 20, the area density in each mesh region 16 of a mesh size $\Delta_{P0}$ needs to have been calculated in advance for at least the region A. Therefore, an adequate time for area calculation is required before starting the writing. Also, as a preprocessing prior to starting the writing operation, when firstly calculating a proximity effect-corrected dose for calculating a fogging effect by using a mesh larger than the original mesh size for the original proximity effect and then calculating a fogging effect-corrected dose, for the entire mask surface by using the method described in the Patent Literature 1, it also becomes necessary that the area density has been calculated in advance. Therefore, it is necessary to have an adequate time for area calculation before starting the writing. FIG. 7 shows a result of comparing the case of Embodiment 1 and the case of the Patent Literature 1 regarding the time for area calculation. The relative value 1 indicates a conventional area computation time. Therefore, in order to shorten the preliminary calculation time compared with the conventional case, the relative value needs to be less than 1. FIG. 7 shows that even when it is about 3σ from the calculation position of the fogging effect-corrected dose based on the method of Embodiment 1, the relative value is less than 1.

It is understood also from this result that it is preferable for the region A to be set at about 1σ from the calculation position of the fogging effect-corrected dose according to the method of Embodiment 1.

As described above, according to Embodiment 1, it is possible to efficiently calculate an exposure dose where a proximity effect and a fogging effect are corrected. Therefore, the computation time can be shortened, thereby reducing the writing time.

In the above description, processing contents or operation contents of what is expressed by the term "unit" or "step" can be configured by computer programs. They may be implemented by software and alternatively, by a combination of hardware and software, or a combination of hardware and firmware. When configured by a program, the program is stored in a recording medium, such as a magnetic disk drive, magnetic tape drive, FD, or ROM (Read Only Memory). For example, it is stored in the magnetic disk drive 146.

The control calculator 110 of FIG. 1 may be connected, through a bus (not shown), to an RAM (Random Access Memory), an ROM, and a magnetic disk (HD) drive, which are examples of a recording device, a keyboard (K/B) and a mouse, which are examples of an input means, a monitor and a printer, which are examples of an output means, or an external interface (I/F), FD, DVD, CD, etc., which are examples of an input/output means.

Referring to specific examples, Embodiments have been described above. However, the present invention is not limited to these examples.

In the example mentioned above, although the mesh size $\Delta_P$ for the proximity effect correction used for correcting a fogging effect is smaller than the mesh size $\Delta_F$ for the fogging effect correction, it is not limited to such. What is necessary for the mesh size $\Delta_P$ for the proximity effect correction used for correcting a fogging effect is to be less than or equal to the mesh size $\Delta_F$ for the fogging effect correction.

Although described only with respect to the x direction in each formula mentioned above for the purpose of easily understanding, it should be understood that it is more preferable to calculate also with respect to the y direction.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other charged particle beam writing apparatus and method that include elements of the present invention and that can be appropriately modified by those skilled in the art are included within the scope of the present invention.

Additional advantages and modification would readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing method comprising:
    calculating a proximity effect-corrected dose for correcting a proximity effect in charged particle beam writing, for each first mesh region made by virtually dividing a writing region of a target object into a plurality of first mesh regions of a first mesh size;
    calculating a fogging effect-corrected dose by using the proximity effect-corrected dose calculated and an area density in the first mesh size with respect to a first part of a calculation region for calculating the fogging effect-corrected dose for correcting a fogging effect in the charged particle beam writing, and by using an area density in a second mesh size larger than the first mesh size with respect to a remaining second part of the calculation region;

synthesizing the fogging effect-corrected dose and the proximity effect-corrected dose for the each first mesh region; and writing a pattern on the target object by using a charged particle beam based on a synthesized correction dose.

2. The method according to claim 1, wherein the fogging effect-corrected dose is calculated in real time with respect to the writing the pattern on the target object.

3. The method according to claim 1, wherein the second mesh size is greater than or equal to 100 times the first mesh size.

4. The method according to claim 1, wherein the writing region is virtually divided into a plurality of strip-like small regions, and when the proximity effect-corrected dose is calculated for a k-th small region, the fogging effect-corrected dose is calculated for a (k−1)th small region at a same time, a (k−1−m)th small region of the target object is written at the same time, and m is an integer greater than or equal to 0.

5. The method according to claim 1, further comprising:
calculating the area density in the first mesh size for the each first mesh region before the calculating the proximity effect-corrected dose.

6. The method according to claim 1, further comprising:
calculating the area density in the second mesh size for the each second mesh region before the calculating the proximity effect-corrected dose.

7. The method according to claim 1, further comprising:
calculating the area density in the first mesh size for the each first mesh region before the calculating the proximity effect-corrected dose; and
calculating the area density in the second mesh size for the each second mesh region before the calculating the proximity effect-corrected dose.

8. The method according to claim 7, wherein the area density in the first mesh size and the area density in the second mesh size are calculated in real time in parallel with respect to the writing the pattern on the target object.

9. The method according to claim 1, wherein when the fogging effect-corrected dose is calculated with respect to the first part of the calculation region, a third mesh size larger than each of the first mesh size and the second mesh size is used.

* * * * *